(12) United States Patent
Zhang et al.

(10) Patent No.: US 11,133,196 B2
(45) Date of Patent: Sep. 28, 2021

(54) GATE ELECTRODE AND METHOD FOR MANUFACTURING THE SAME, AND METHOD FOR MANUFACTURING ARRAY SUBSTRATE

(71) Applicant: BOE TECHNOLOGY GROUP CO., LTD., Beijing (CN)

(72) Inventors: Bin Zhang, Beijing (CN); Chienhung Liu, Beijing (CN); Yucheng Chan, Beijing (CN); Xuefei Sun, Beijing (CN); Tingting Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 495 days.

(21) Appl. No.: 16/303,959

(22) PCT Filed: May 23, 2018

(86) PCT No.: PCT/CN2018/087970
§ 371 (c)(1),
(2) Date: Nov. 21, 2018

(87) PCT Pub. No.: WO2018/214899
PCT Pub. Date: Nov. 29, 2018

(65) Prior Publication Data
US 2021/0242033 A1    Aug. 5, 2021

(30) Foreign Application Priority Data

May 26, 2017   (CN) .......................... 201710389075.7

(51) Int. Cl.
*H01L 21/8234* (2006.01)
*H01L 29/66* (2006.01)
(Continued)

(52) U.S. Cl.
CPC ...... *H01L 21/324* (2013.01); *H01L 21/02595* (2013.01); *H01L 21/82345* (2013.01); *H01L 29/66765* (2013.01); *H01L 29/78678* (2013.01)

(58) Field of Classification Search
CPC ............. H01L 21/324; H01L 21/02595; H01L 21/82345; H01L 29/66765; H01L 29/78678
See application file for complete search history.

(56) References Cited

U.S. PATENT DOCUMENTS 10,224,252 B2   3/2019  Zhang et al.
10,243,009 B2   3/2019  Li et al.
(Continued)

FOREIGN PATENT DOCUMENTS

CN     101957530 A     1/2011
CN     106206456 A    12/2016
(Continued)

OTHER PUBLICATIONS

Office Action dated Nov. 18, 2019 issued in corresponding Chinese Application No. 201710389075.7.
(Continued)

*Primary Examiner* — David Vu
(74) *Attorney, Agent, or Firm* — Nath, Goldberg & Meyer; Joshua B. Goldberg

(57) ABSTRACT

A gate electrode and a method for manufacturing the same, and a method for manufacturing an array substrate are provided. The method for manufacturing a gate electrode may include: providing a substrate, wherein the substrate includes a gate electrode region and a non-gate electrode region; and forming a gate electrode layer on the substrate, wherein the gate electrode layer includes a conductive portion corresponding to the gate electrode region and a
(Continued)

transparent portion corresponding to the non-gate electrode region. According to the gate electrode and the method for manufacturing the same, and the method for manufacturing an array substrate, step difference can be eliminated, thereby avoiding an influence of the step difference on the crystallization property of a polysilicon material when an Excimer Laser Annealing (ELA) process is performed on the amorphous silicon layer, and obtaining a better crystallization effect.

16 Claims, 3 Drawing Sheets

(51) Int. Cl.
  *H01L 29/786* (2006.01)
  *H01L 21/324* (2006.01)
  *H01L 21/02* (2006.01)

(56) References Cited

U.S. PATENT DOCUMENTS

2010/0059757 A1    3/2010  Kim et al.
2015/0303225 A1*  10/2015  Jiang ................... H01L 27/1288
                                                              257/72

FOREIGN PATENT DOCUMENTS

| CN | 106531746 A | 3/2017 |
| CN | 107170806 A | 9/2017 |
| JP | H4-7876 A | 1/1992 |
| JP | H9-116161 A | 5/1997 |
| JP | 2002268082 A | 9/2002 |
| JP | 2003115496 A | 4/2003 |

OTHER PUBLICATIONS

International Search Report dated Jun. 27, 2018 corresponding to application No. PCT/CN2018/087970.
Office Action dated Jun. 10, 2019 issued in corresponding Chinese Application No. 201710389075.7.

* cited by examiner

GATE ELECTRODE AND METHOD FOR MANUFACTURING THE SAME, AND METHOD FOR MANUFACTURING ARRAY SUBSTRATE

CROSS-REFERENCE TO RELATED APPLICATIONS

This is a National Phase Application filed under 35 U.S.C. 371 as a national stage of PCT/CN2018/087970, filed May 23, 2018, an application claiming the priority of Chinese Patent Application No. 201710389075.7, filed on May 26, 2017 in the China Patent Office, the contents of which are incorporated herein by reference in its entirety.

TECHNICAL FIELD

The disclosure relates to the field of display technology, and in particular, to a gate electrode and a method for manufacturing the same, and a method for manufacturing an array substrate.

BACKGROUND

Low Temperature Poly-silicon (LTPS) technology has become the mainstream technology for the industry of small and medium-sized display in the current market due to its advantages such as ultra-thin size, ultra-light weight, and low energy consumption.

SUMMARY

According to an aspect of the disclosure, a method for manufacturing a gate electrode is provided, the method may include: a step S1 of providing a substrate, the substrate comprising a gate electrode region and a non-gate electrode region; and a step S2 of forming a gate electrode layer on the substrate, the gate electrode layer comprising a conductive portion corresponding to the gate electrode region and a transparent portion corresponding to the non-gate electrode region, wherein the conductive portion has a thickness equal to a thickness of the transparent portion.

In an embodiment, the step S2 may further include: a step S21 of forming a metal material layer on the substrate; a step S22 of forming a patterned mask layer on the metal material layer, a portion of the metal material layer corresponding to the gate electrode region is covered by the patterned mask layer; and a step S23 of oxidizing a portion of the metal material layer corresponding to the non-gate electrode region to a transparent oxide layer by oxidizing the portion of the metal material layer corresponding to the non-gate electrode region.

In an embodiment, the metal material layer is a metal layer of tantalum, and the transparent oxide layer is a transparent layer of tantalum oxide.

In an embodiment, the transparent layer of tantalum oxide contains tantalum trioxide or tantalum pentoxide.

In an embodiment, the step S22 further comprises: a step S221 of forming a mask layer on an entire surface of the metal material layer; and a step S222 of patterning the mask layer by performing a photolithography process on the mask layer so as to form the patterned mask layer.

According to an aspect of the disclosure, a method for manufacturing an array substrate is provided, the method may include: a step S100 of forming the gate electrode layer on the substrate by using the method described above.

In an embodiment, after the step S100, the method may further include: a step S200 of forming a gate insulating layer on the gate electrode layer and forming an active layer on the gate insulating layer.

In an embodiment, the step S200 may further include: a step S201 of forming the gate insulating layer on the gate electrode layer; a step S202 of forming an amorphous silicon layer on the gate insulating layer; and a step S203 of converting the amorphous silicon layer into a polysilicon layer served as the active layer by performing an Excimer Laser Annealing (ELA) process on the amorphous silicon layer.

In an embodiment, the gate insulating layer and the amorphous silicon layer are formed by Plasma Enhanced Chemical Vapor Deposition (PECVD) process.

According to an aspect of the disclosure, a gate electrode is provided. The gate electrode may include: a gate electrode layer disposed on a substrate. The substrate includes a gate electrode region and a non-gate electrode region; the gate electrode layer includes a conductive portion corresponding to the gate electrode region and a transparent portion corresponding to the non-gate electrode region, and the conductive portion has a thickness equal to a thickness of the transparent portion.

DETAILED DESCRIPTION

In order to enable those skilled in the art to better understand the technical solutions of the present disclosure, a gate electrode, a method for manufacturing the same, and a method for manufacturing an array substrate according to embodiments of the disclosure are described in detail below with reference to the accompanying drawings.

Figure 1:
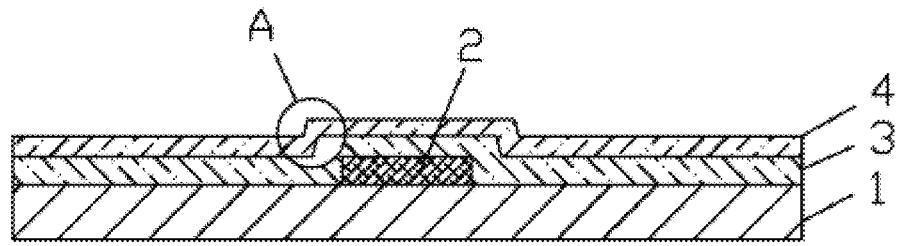
FIG. 1 is a schematic view illustrating a structure of an array substrate according to a LTPS technology in related art.

FIG. 1 is a schematic view of a structure of an array substrate according to a LTPS technology in related art. Referring to FIG. 1, the array substrate includes a substrate 1, a gate electrode layer 2 disposed on the substrate 1, a gate insulating layer 3 disposed on the gate electrode layer 2, and an active layer 4 (a polysilicon layer) disposed on the gate insulating layer 3. since the above-mentioned gate electrode layer 2 is served as a bottom gate electrode, there is a problem in practical application that the crystallization property of a polysilicon material may be degraded in the subsequent Excimer Laser Annealing (ELA) process for the amorphous silicon layer, due to a step difference (position A in FIG. 1) at an interface between a region where the gate electrode is located and the other region in the gate electrode layer 2, thereby affecting the crystallization effect.

Figure 2:
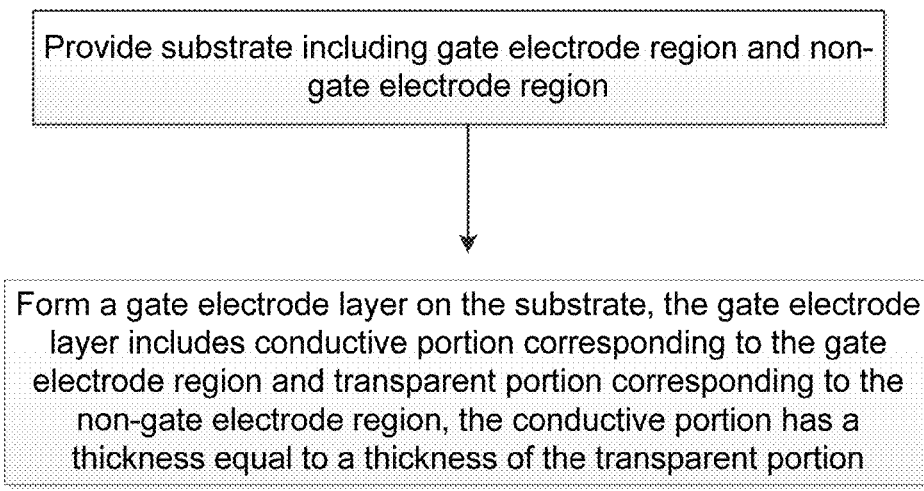
FIG. 2 is a flow chart illustrating a method for manufacturing a gate electrode according to an embodiment of the present disclosure.
Figure 3:
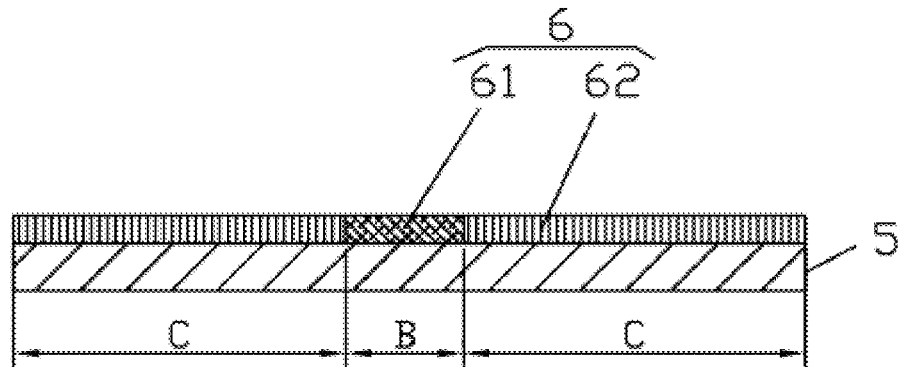
FIG. 3 is a diagram illustrating a structure of a gate electrode obtained by using the method for manufacturing a gate electrode according to an embodiment of the present disclosure.

Referring to FIG. 2 together with FIG. 3, a method for manufacturing a gate electrode according to the present disclosure may include steps S1 and S2 as follows.

At step S1, a substrate 5 is provided, and the substrate 5 includes a gate electrode region B and a non-gate electrode region C.

At step S2, a gate electrode layer 6 is formed on the substrate 5.

The gate electrode layer 6 includes a conductive portion 61 corresponding to the gate electrode region B and a transparent portion 62 corresponding to the non-gate electrode region C. The conductive portion 61 has a thickness equal to a thickness of the transparent portion 62. The arrangement of the transparent portion eliminates the step difference at an interface between the non-gate electrode region C and the conductive portion 61 in the gate electrode region B, thereby avoiding an influence of the step difference on the crystallization property of a polysilicon material, and obtaining a better crystallization effect.

A method for manufacturing the gate electrode according to an embodiment of the present disclosure is described in detail below. Specifically, the step S2 described above further includes steps S21, S22 and S23.

Figure 4A:
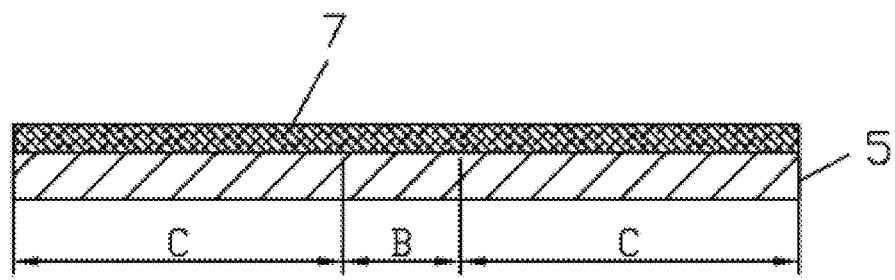
FIG. 4A is a diagram illustrating a first process in the method for manufacturing a gate electrode according to an embodiment of the present disclosure.

At step S21, a conductive metal material layer 7 to be oxidized to a transparent oxide is formed on the substrate 1, as shown in FIG. 4A.

Figure 4B:
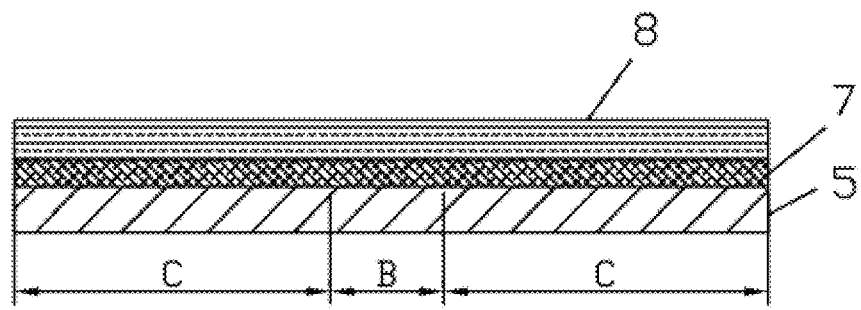
FIG. 4B is a diagram illustrating a second process in the method for manufacturing a gate electrode according to an embodiment of the present disclosure.
Figure 4C:
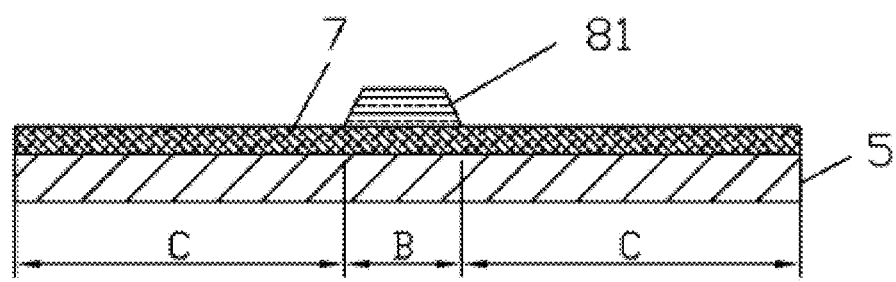
FIG. 4C is a diagram illustrating a third process in the method for manufacturing a gate electrode according to an embodiment of the present disclosure.

At step S22, a patterned mask layer 81 is formed on the metal material layer 7, and the patterned mask layer 81 covers a portion of the metal material layer 7 corresponding to the gate electrode region B, as shown in FIG. 4C.

The step 22 of forming the patterned mask layer 81 may further include steps S221 and S222.

At step S221, a mask layer 8 is formed on an entire surface of the metal material layer 7, as shown in FIG. 4B.

At step S222, the mask layer 8 is patterned by performing a photolithography process on the mask layer 8, so as to form the patterned mask layer 81.

Figure 4D:
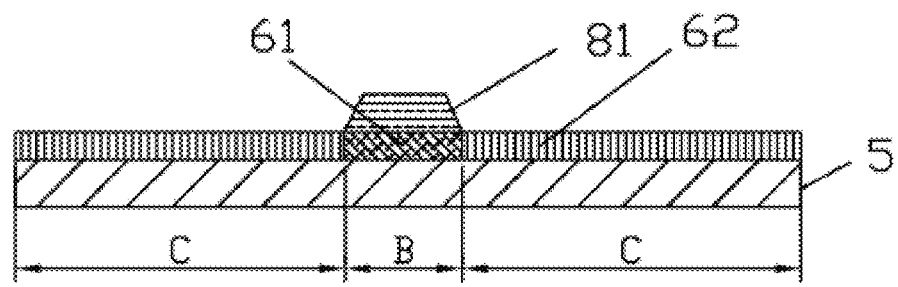
FIG. 4D is a is a diagram illustrating a fourth process in the method for manufacturing a gate electrode according to an embodiment of the present disclosure.

At step S23, a portion of the metal material layer 7 corresponding to the non-gate electrode region C is oxidized, so that the portion of the metal material layer 7 corresponding to the non-gate electrode region C is oxidized to a transparent metal oxide layer, and the transparent metal oxide layer is served as the transparent portion 62 described above, as shown in FIG. 4D.

Further, under the masking of the mask layer 8 for masking the portion of the metal material layer 7 corresponding to the gate electrode region B, the portion of the metal material layer 7 corresponding to the gate electrode region B is not oxidized, thereby forming the above-described conductive portion 61.

The portion of the metal material layer 7 corresponding to the non-gate electrode region C may be oxidized by using hydrogen peroxide in the oxidation process described above.

In an embodiment, the metal material layer 7 is a metal layer of tantalum. The metal layer of tantalum may be oxidized so as to form a transparent layer of tantalum oxide.

The transparent layer of tantalum oxide includes tantalum trioxide or tantalum pentoxide, and the like.

Of course, in practical applications, the metal layer of tantalum may be formed in the gate electrode region B by any other means, and the transparent layer of tantalum oxide may be formed in the non-gate electrode region C by any other means. Alternatively, other conductive film layers may be formed in the gate electrode region B, and other transparent film layers may be formed in the non-gate electrode region C.

Finally, the patterned mask layer 81 is removed so as to form the gate electrode.

Figure 5:
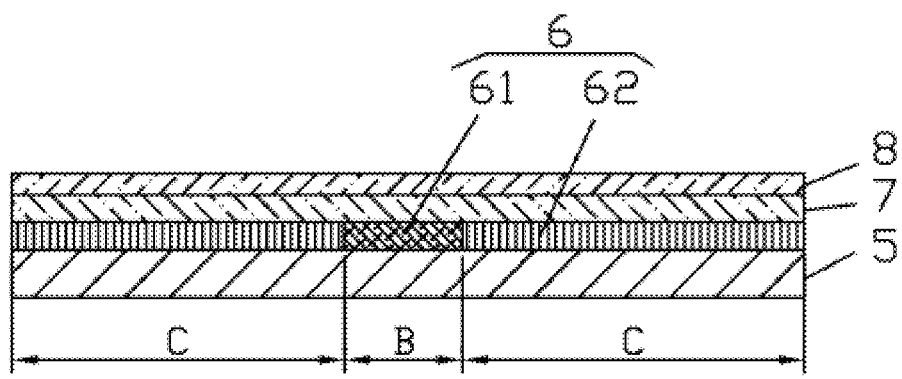
FIG. 5 is a diagram illustrating a structure of an array substrate obtained by using a method for manufacturing an array substrate according to an embodiment of the present disclosure.

Referring to FIG. 5, a method for manufacturing an array substrate according to an embodiment of the present disclosure is provided, the method may further include steps S100 and S200.

At step S100, a gate electrode layer 6 is formed on a substrate 5 according to the method for manufacturing a gate electrode of the above-described embodiment of the present disclosure.

The above-described gate electrode layer 6 includes a conductive portion 61 corresponding to the gate electrode region B and a transparent portion 62 corresponding to the non-gate electrode region C, and a thickness of the conductive portion 61 is coincided with a thickness of the transparent portion 62. The arrangement of the transparent portion 62 eliminates the step difference at the interface between the non-gate electrode region C and the conductive portion 61 in the gate electrode region B, thereby avoiding an influence of the step difference on the crystallization property of a polysilicon material, and obtaining a better crystallization effect.

After the step S100, the method may further include a step S200.

At step S200, a gate insulating layer 7 is formed on the gate electrode layer 6, and an active layer 8 is formed on the gate insulating layer 7.

In an embodiment, the step S200 further includes steps S201, S202 and S203.

At step S201, the gate insulating layer 7 is formed on the gate electrode layer 6.

At step S202, an amorphous silicon layer is formed on the gate insulating layer 7.

At step S203, the amorphous silicon layer is converted into a polysilicon layer by performing an Excimer Laser Annealing (ELA) process on the amorphous silicon layer.

The polysilicon layer is served as the active layer 8.

In an embodiment, the gate insulating layer 7 and the amorphous silicon layer may be formed by setting specified process parameters and using a deposition chamber.

The deposition chamber may be, for example, a Plasma Enhanced Chemical Vapor Deposition (PECVD) chamber.

In addition, in practical applications, the method for manufacturing the array substrate described above may further include sequentially forming an interlayer dielectric layer, a source/drain electrode, an insulating layer, a common electrode, a protective layer, a pixel electrode, and the like on the active layer 8.

According to an embodiment, a gate electrode is provided in the disclosure. Referring to FIG. 3, the gate electrode includes a gate electrode layer 6 on the substrate 5. The substrate 5 includes a gate electrode region B and a non-gate electrode region C. The gate electrode layer 6 includes a conductive portion 61 corresponding to the gate electrode region B and a transparent portion 62 corresponding to the non-gate electrode region C, and the conductive portion 61 has a thickness equal to a thickness of the transparent portion 62.

According to a gate electrode of the disclosure, the gate electrode layer 6 includes a conductive portion 61 corresponding to the gate electrode region B and a transparent portion 62 corresponding to the non-gate electrode region C, the arrangement of the transparent portion 62 eliminates the step difference at the interface between the non-gate electrode region C and the conductive portion 61 in the gate electrode region B, thereby avoiding an influence of the step difference on the crystallization property of a polysilicon material, and obtaining a better crystallization effect.

It should be understood that the above implementations are merely exemplary embodiments for the purpose of illustrating the principles of the present disclosure, and the present disclosure is not limited thereto. It should be apparent to those skilled in the art that various changes and modifications can be made without departing from the spirit and spirit of the present disclosure, which are also to be regarded as the scope of the present disclosure.

What is claimed is:

1. A method for manufacturing a gate electrode, comprising:
    a step S1 of providing a substrate, the substrate comprising a gate electrode region and a non-gate electrode region; and
    a step S2 of forming a gate electrode layer on the substrate, the gate electrode layer comprising a conductive portion corresponding to the gate electrode region and a transparent portion corresponding to the non-gate electrode region,
    wherein the conductive portion has a thickness equal to a thickness of the transparent portion.

2. The method according to claim 1, wherein the step S2 further comprises:
    a step S21 of forming a metal material layer on the substrate;
    a step S22 of forming a patterned mask layer on the metal material layer, so that a portion of the metal material layer corresponding to the gate electrode region is covered by the patterned mask layer; and
    a step S23 of oxidizing a portion of the metal material layer corresponding to the non-gate electrode region to a transparent oxide layer by oxidizing the portion of the metal material layer corresponding to the non-gate electrode region.

3. The method according to claim 2, wherein
    the metal material layer is a metal layer of tantalum, and the transparent oxide layer is a transparent layer of tantalum oxide.

4. The method according to claim 3, wherein the transparent layer of tantalum oxide contains tantalum trioxide or tantalum pentoxide.

5. The method according to claim 2, wherein the step S22 further comprises:
    a step S221 of forming a mask layer on an entire surface of the metal material layer; and
    a step S222 of patterning the mask layer by performing a photolithography process on the mask layer so as to form the patterned mask layer.

6. A method for manufacturing an array substrate, comprising:
    a step S100 of forming the gate electrode layer on the substrate by using the method of claim 5.

7. The method according to claim 6, after the step S100, further comprising:
    a step S200 of forming a gate insulating layer on the gate electrode layer and forming an active layer on the gate insulating layer.

8. The method according to claim 7, wherein the step S200 further comprises:
    a step S201 of forming the gate insulating layer on the gate electrode layer;
    a step S202 of forming an amorphous silicon layer on the gate insulating layer; and
    a step S203 of converting the amorphous silicon layer into a polysilicon layer served as the active layer by performing an Excimer Laser Annealing (ELA) process on the amorphous silicon layer.

9. A method for manufacturing an array substrate, comprising:
    a step S100 of forming the gate electrode layer on the substrate by using the method of claim 2.

10. The method according to claim 9, after the step S100, further comprising:
    a step S200 of forming a gate insulating layer on the gate electrode layer and forming an active layer on the gate insulating layer.

11. The method according to claim 10, wherein the step S200 further comprises:
    a step S201 of forming the gate insulating layer on the gate electrode layer;
    a step S202 of forming an amorphous silicon layer on the gate insulating layer; and
    a step S203 of converting the amorphous silicon layer into a polysilicon layer served as the active layer by performing an Excimer Laser Annealing (ELA) process on the amorphous silicon layer.

12. A method for manufacturing an array substrate, comprising:
    a step S100 of forming the gate electrode layer on the substrate by using the method of claim 1.

13. The method according to claim 12, after the step S100, further comprising:
    a step S200 of forming a gate insulating layer on the gate electrode layer and forming an active layer on the gate insulating layer.

14. The method according to claim 13, wherein the step S200 further comprises:
    a step S201 of forming the gate insulating layer on the gate electrode layer;
    a step S202 of forming an amorphous silicon layer on the gate insulating layer; and
    a step S203 of converting the amorphous silicon layer into a polysilicon layer served as the active layer by performing an Excimer Laser Annealing (ELA) process on the amorphous silicon layer.

15. The method according to claim 14, wherein the gate insulating layer and the amorphous silicon layer are formed by Plasma Enhanced Chemical Vapor Deposition (PECVD) process.

16. A gate electrode, comprising: a gate electrode layer disposed on a substrate, wherein the substrate comprises a gate electrode region and a non-gate electrode region; the gate electrode layer comprises a conductive portion corresponding to the gate electrode region and a transparent portion corresponding to the non-gate electrode region, and the conductive portion has a thickness equal to a thickness of the transparent portion.

* * * * *